(12) United States Patent
Jin et al.

(10) Patent No.: US 10,381,504 B2
(45) Date of Patent: Aug. 13, 2019

(54) WAFER LEVEL PACKAGING, OPTICAL DETECTION SENSOR AND METHOD OF FORMING SAME

(71) Applicant: STMicroelectronics Pte Ltd, Singapore (SG)

(72) Inventors: Yonggang Jin, Singapore (SG); Wee Chin Judy Lim, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 0 days.

(21) Appl. No.: 15/969,908

(22) Filed: May 3, 2018

(65) Prior Publication Data

US 2018/0248068 A1 Aug. 30, 2018

Related U.S. Application Data

(60) Division of application No. 14/968,359, filed on Dec. 14, 2015, now Pat. No. 9,991,409, which is a
(Continued)

(51) Int. Cl.
*H01L 31/16* (2006.01)
*H01L 31/0232* (2014.01)
(Continued)

(52) U.S. Cl.
CPC ............ *H01L 31/16* (2013.01); *G01S 7/4813* (2013.01); *G01S 17/026* (2013.01); *H01L 25/167* (2013.01); *H01L 31/0232* (2013.01); *H01L 31/02327* (2013.01); *H01L 31/167* (2013.01); *H01L 31/18* (2013.01); *H01L 31/186* (2013.01); *H03K 17/941* (2013.01);
(Continued)

(58) Field of Classification Search
CPC ... H01L 31/16; H01L 31/0232; H01L 25/167; H01L 31/167; H01L 31/18; H01L 31/186; H01L 21/568; H01L 2224/04105; H01L 2224/18; H01L 2224/19; H01L 2924/3511; H03K 2217/96023; H03K 17/9638; H03K 17/9631; G01V 8/12; Y10T 156/1064; Y10T 156/1052; G01S 17/026; G01S 7/4813
See application file for complete search history.

(56) References Cited

U.S. PATENT DOCUMENTS

5,010,024 A 4/1991 Allen et al.
5,150,438 A 9/1992 Brown
(Continued)

*Primary Examiner* — Georgia Y Epps
*Assistant Examiner* — Don J Williams
(74) *Attorney, Agent, or Firm* — Crowe & Dunlevy (57) ABSTRACT

An optical detection sensor functions as a proximity detection sensor that includes an optical system and a selectively transmissive structure. Electromagnetic radiation such as laser light can be emitted through a transmissive portion of the selectively transmissive structure. A reflected beam can be detected to determine the presence of an object. The sensor is formed by encapsulating the transmissive structure in a first encapsulant body and encapsulating the optical system in a second encapsulant body. The first and second encapsulant bodies are then joined together. In a wafer scale assembling the structure resulting from the joined encapsulant bodies is diced to form optical detection sensors.

12 Claims, 10 Drawing Sheets

Related U.S. Application Data continuation of application No. 13/670,766, filed on Nov. 7, 2012, now abandoned.

(60) Provisional application No. 61/559,532, filed on Nov. 14, 2011.

(51) Int. Cl.
*H01L 31/18* (2006.01)
*H03K 17/94* (2006.01)
*H03K 17/96* (2006.01)
*H01L 31/167* (2006.01)
*G01S 17/02* (2006.01)
*G01S 7/481* (2006.01)
*H01L 25/16* (2006.01)
*G01V 8/12* (2006.01)
*H01L 21/56* (2006.01)

(52) U.S. Cl.
CPC ..... *H03K 17/9631* (2013.01); *H03K 17/9638* (2013.01); *G01V 8/12* (2013.01); *H01L 21/568* (2013.01); *H01L 2224/04105* (2013.01); *H01L 2224/18* (2013.01); *H01L 2224/19* (2013.01); *H01L 2924/3511* (2013.01); *H03K 2217/96023* (2013.01); *Y10T 156/1052* (2015.01); *Y10T 156/1064* (2015.01)

(56) References Cited

U.S. PATENT DOCUMENTS

| | | | |
|---|---|---|---|
| 6,844,562 B2 | 1/2005 | Takaoka et al. | |
| 6,845,118 B1 | 1/2005 | Scott | |
| 8,012,776 B2 | 9/2011 | Derderian | |
| 8,304,850 B2 * | 11/2012 | Lazarov | G01J 5/02 250/338.1 |
| 8,362,496 B1 | 1/2013 | Tu et al. | |
| 2004/0201080 A1 | 10/2004 | Basoor et al. | |
| 2005/0286840 A1 | 12/2005 | Ho et al. | |
| 2009/0108181 A1 | 4/2009 | Ishihara et al. | |
| 2010/0025824 A1 | 2/2010 | Chen et al. | |
| 2010/0163759 A1 * | 7/2010 | Castagna | G01J 1/4204 250/552 |
| 2010/0258710 A1 | 10/2010 | Wiese et al. | |
| 2011/0024627 A1 | 2/2011 | Yao | |
| 2011/0204233 A1 | 8/2011 | Costello et al. | |
| 2011/0248152 A1 | 10/2011 | Svajda et al. | |
| 2013/0049218 A1 | 2/2013 | Gong et al. | |
| 2013/0075764 A1 | 3/2013 | Yu | |
| 2016/0099373 A1 | 4/2016 | Jin et al. | |

\* cited by examiner

WAFER LEVEL PACKAGING, OPTICAL DETECTION SENSOR AND METHOD OF FORMING SAME

CROSS-REFERENCE TO RELATED APPLICATIONS

This application is a divisional of U.S. application patent Ser. No. 14/968,359, filed Dec. 14, 2015, which is a continuation of U.S. patent application Ser. No. 13/670,766 filed Nov. 7, 2012, now abandoned, which claims priority to U.S. Provisional Application No. 61/559,532, filed Nov. 14, 2011, the disclosures of which are hereby incorporated by reference.

BACKGROUND

1. Technical Field

The techniques described herein relate to an optical detection sensor, a wafer level package and a technique for forming the same.

2. Discussion of the Related Art

A proximity detector is an optical detection sensor that is capable of detecting the presence of a nearby object. An optical detection sensor may emit a beam of electromagnetic radiation (e.g., infrared radiation) and detect a reflected beam from a target object.

SUMMARY

Some embodiments relate to an optical detection apparatus. The optical detection apparatus includes a device configured to emit electromagnetic radiation, a structure including a first region of transmissive material to allow a first portion of the electromagnetic radiation to pass through the first region to an exterior of the optical detection apparatus. The structure is configured to reflect a second portion of the electromagnetic radiation. The optical detection apparatus also includes a sensor configured to detect the second portion of the electromagnetic radiation.

Some embodiments relate to a method of forming at least a selectively transmissive structure. The method includes forming a first region of transmissive material, forming a second region of transmissive material. The second region of transmissive material having a shape different from that of the first region of transmissive material. The method also includes contacting the first and second regions of transmissive material to an adhesive, and encapsulating the first and second regions of transmissive material.

Some embodiments relate to a method of forming at least an optical system. The method includes contacting a device for emitting electromagnetic radiation and a sensor chip to an adhesive material, the sensor chip having a plurality of optical sensors, and encapsulating the device for emitting electromagnetic radiation and the sensor chip.

In an embodiment, a method comprises: forming a transmissive structure, comprising: placing a first region of transmissive material and a second region of transmissive material on a first support; and encapsulating the first and second regions of transmissive material with an encapsulant to form a first encapsulating body for said transmissive structure; forming an optical system, comprising: placing an electromagnetic emitter circuit and an electromagnetic sensor circuit on a second support; and encapsulating the electromagnetic emitter circuit and electromagnetic sensor circuit with an encapsulant to form a second encapsulating body for said optical system; and joining the first encapsulating body to the second encapsulating body such that said first region of transmissive material is aligned with the electromagnetic emitter circuit and said second region of transmissive material is aligned with said electromagnetic sensor circuit.

In an embodiment, a method comprises: forming a first encapsulating body including a plurality of transmissive structures, comprising: placing for each transmissive structure a first region of transmissive material and a second region of transmissive material on a first support; and encapsulating the first and second regions of transmissive material for each of the plurality of transmissive structures with an encapsulant to form said first encapsulating body; forming a second encapsulating body including a plurality of optical systems, comprising: placing for each optical system an electromagnetic emitter circuit and an electromagnetic sensor circuit on a second support; and encapsulating the electromagnetic emitter circuit and electromagnetic sensor circuit for each of the optical systems with an encapsulant to form said second encapsulating body; joining the first encapsulating body to the second encapsulating body such that each first region of transmissive material is aligned one of the electromagnetic emitter circuits and each second region of transmissive material is aligned with one of the electromagnetic sensor circuits to produce a combined structure; and dicing the combined structure to form a plurality of optical detection sensors, wherein each optical detection sensor includes one transmissive structure and one optical system.

The foregoing summary is provided by way of illustration and is not intended to be limiting.

BRIEF DESCRIPTION OF THE DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of at least one embodiment.

FIGS. 7a-7e-2 show a process of forming an optical system of an optical detection sensor, according to some embodiments. The optical system may be formed on the wafer level, e.g., with a 200 mm or 300 mm wafer size.

DETAILED DESCRIPTION

Described herein is an optical detection sensor and method of forming the same.

Figure 1A:
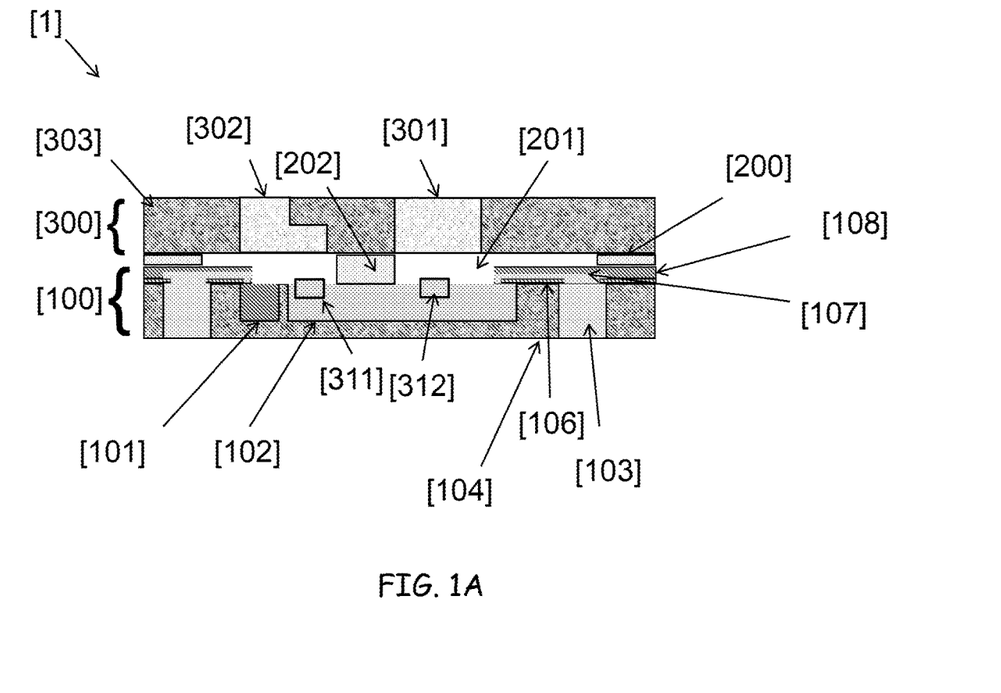
FIGS. 1A and 1B show cross sections of optical detection sensors, according to some embodiments.

FIG. 1A shows a cross-section of an optical detection sensor 1 that may include an optical system 100 bonded to a selectively transmissive structure 300 using a bonding material 200, according to some embodiments.

As shown in FIG. 1A, the optical system 100 may include a device 101 configured to emit an electromagnetic signal and a detection sensor chip 102 that includes a first sensor 311 for detecting an electromagnetic signal and a second sensor 312 for detecting an electromagnetic signal. Sensor chip 102 may include electronics such as amplification circuitry and/or circuitry for determining whether an object has been detected. Device 101 may include a laser or other device for emitting electromagnetic radiation. The optical system 100 may also include one or more metal plugs 103, a metal interconnect 107 contacting the metal plug(s) 103, and a passivation layer 108. The metal plugs 103 and metal interconnect 107 may be electrically coupled to the sensor chip 102. At least a portion of the optical system 100 may be embedded in an encapsulant material 104, which may be a polymer material such as epoxy.

The selectively transmissive structure 300 may include regions 301, 302 of transmissive material embedded in an encapsulant material 303, which may be a polymer material such as epoxy. In some embodiments, encapsulant material 303 may be formed of the same material as that of encapsulant material 104. Regions 301 and 302 of transmissive material may be formed of glass, or any other suitable transmissive material. For example, regions 301 and 302 may be formed of a material capable of allowing electromagnetic radiation having a wavelength of the electromagnetic radiation emitted by device 101 to pass therethrough. The encapsulant material 303 may be opaque to electromagnetic radiation having the wavelength of the electromagnetic radiation emitted by device 101. Thus, regions 301 and 302 may operate as windows enabling electromagnetic radiation to selectively pass through structure 300. In some embodiments, selectively transmissive structure 300 and optical device 100 may be formed on a 200 mm or 300 mm diameter wafer with multiple devices according to the same pattern.

A bonding material 200 may be disposed between the optical system 100 and the selectively transmissive structure 300 to bond the optical system 100 to the selectively transmissive structure 300. Any suitable bonding material 200 may be used, such as a double sided glue, for example. In addition, an opaque region 202 may be disposed between the optical system 100 and structure 300 in a region between the sensors 311 and 312. Opaque region 202 may prevent the direct passage of light between the device 101 and cavity 201, thereby preventing direct passage of light from device 101 to sensor 312.

In operation, optical detection sensor 1 may detect a nearby object by transmitting, through transmissive region 302, the electromagnetic radiation produced by device 101. If a nearby object is present, the transmitted electromagnetic radiation may be reflected by the object and then pass back into the interior of the optical detection sensor 1 through transmissive region 301. The reflected electromagnetic radiation passing through transmissive region 301 may then be detected by sensor 312. The optical detection sensor 1 may determine that a nearby object is present based upon the reflected signal detected by sensor 312.

A portion of the electromagnetic radiation generated by device 101 may be detected by sensor 311. By detecting the electromagnetic radiation generated by device 101, the optical detection sensor may determine whether device 101 is functioning properly.

In some embodiments, optical detection sensor 1 may include a reflective region that reflects a portion of the electromagnetic radiation generated by device 101 to sensor 311. For example, as shown in FIG. 1A, transmissive region 302 may be formed in a shape that enables a portion of the electromagnetic radiation generated by device 101 to be transmitted therethrough, and a portion of the electromagnetic radiation to be reflected to sensor 311. FIG. 1A shows in example in which the transmissive region 302 has L-shape. In this example, the right side of the transmissive region 302 extends only partially through the encapsulant 303. Electromagnetic radiation incident upon the right side of transmissive region 302 is reflected by the uppermost edge of the transmissive region 302, causing a portion of the electromagnetic radiation produced by device 101 to be detected by sensor 311.

Transmissive region 302 may have an L-shape or any other suitable shape. For example, transmissive region 302 may have a shape suitable for reflecting a portion of the electromagnetic radiation incident theron while transmitting a portion of the electromagnetic radiation therethrough. The transmissive region 302 may include a reflective portion different from the uppermost and lowermost surfaces of region 302.

Figure 1B:
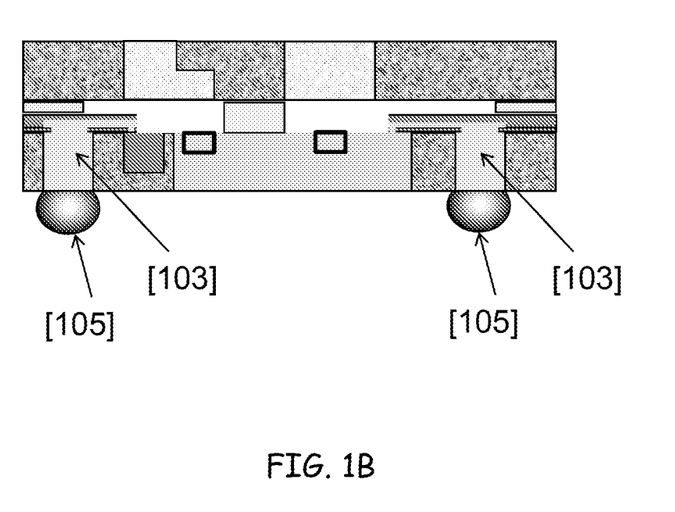

FIG. 1B shows that solder balls 105 may be optionally formed on the lower surface of the optical detection sensor 1. For example, one or more solder balls 105 may be formed on the metal plug(s) 103.

Figure 2:
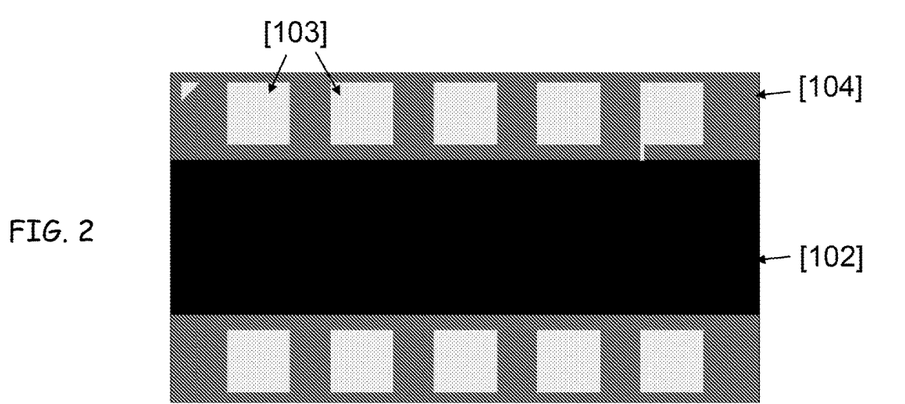
FIG. 2 shows a bottom view of an optical detection sensor.

FIG. 2 shows a bottom view of the optical detection sensor 1, according to some embodiments. As shown in FIG. 2, contact regions of the metal plugs 103 may be exposed at the bottom surface of the encapsulant 104.

Figure 3:
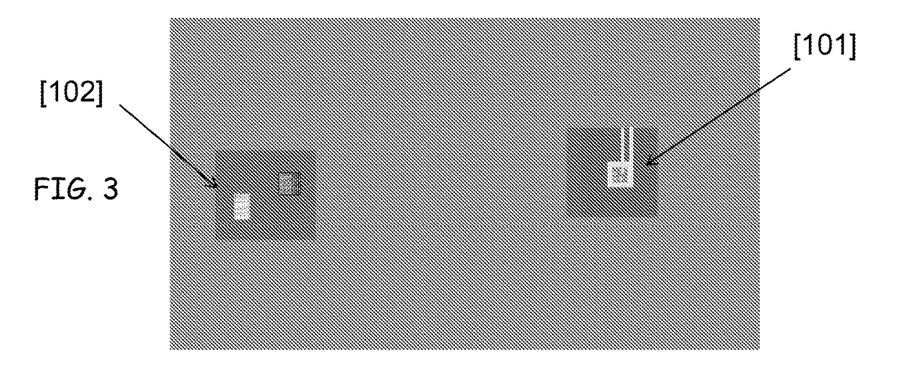
FIG. 3 schematically shows a top view of an optical system of the optical detection sensor.

FIG. 3 schematically shows a top view of the optical system 100, illustrating device 101 for producing electromagnetic radiation as well as sensor chip 102.

A technique for forming the optical detection sensor 1 will be described. The method of forming optical detection sensor 1 may include a method for producing a selectively transmissive structure 300, as illustrated in FIGS. 4-6d.

Figure 4:
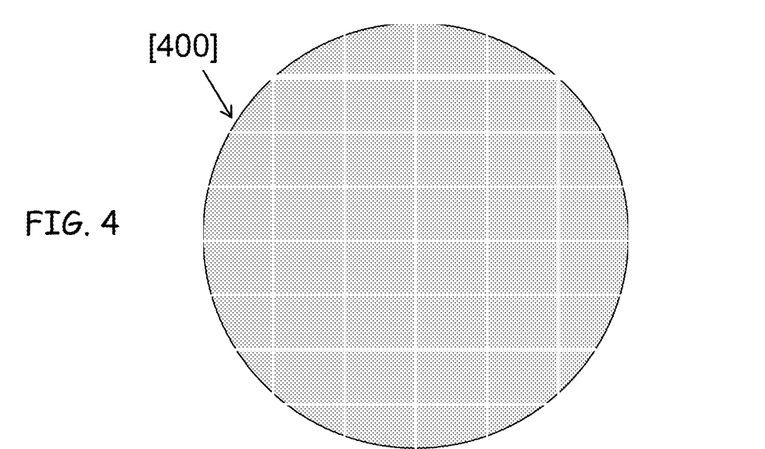
FIG. 4 shows an example of a glass panel from which transmissive glass regions may be formed.
Figure 5:
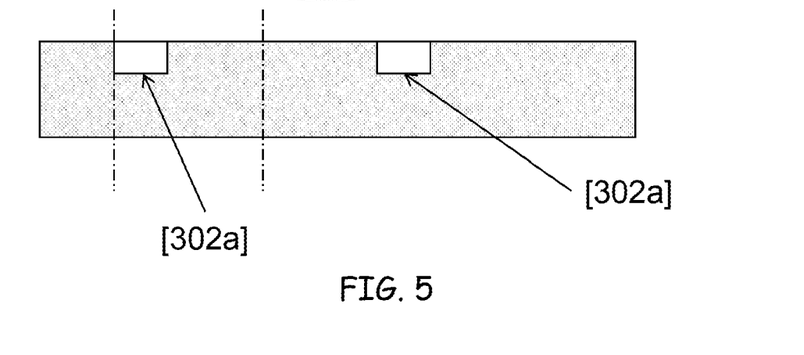
FIG. 5 shows a cross section of the glass panel having trenches formed therein.

FIGS. 4 and 5 illustrate a technique for forming a transmissive region 302 having an L-shape, according to some embodiments. As shown in FIG. 4, the transmissive region 302 may be formed from a glass panel 400. Any suitable shape of glass panel 400 may be used. The glass panel 400 may be cut in a cross-hatched pattern, as shown in FIG. 4, to produce trenches 302(a) in the glass panel, as shown in FIG. 5. The glass panel 400 may then be cut along the dashed lines shown in FIG. 5 to produce an L-shaped transmissive region 302. Transmissive regions 301 having a rectangular cross section may be formed by cutting portions of a glass panel that do not include trenches 302(a).

Figure 6A:
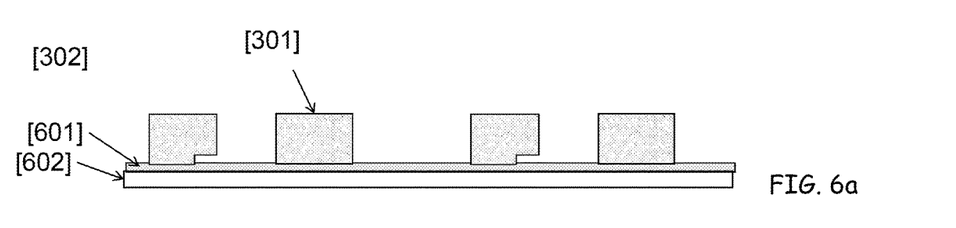
FIGS. 6a-6d show a process of forming a selectively transmissive structure, according to some embodiments.

FIG. 6a shows that the transmissive regions 301 and 302 may be affixed to an adhesive 601, which may be an adhesive tape. The adhesive 601 may be disposed on a solid handle substrate 602, which may be formed of a metal, a semiconductor, or another solid material (e.g., a rigid material).

Figure 6B:
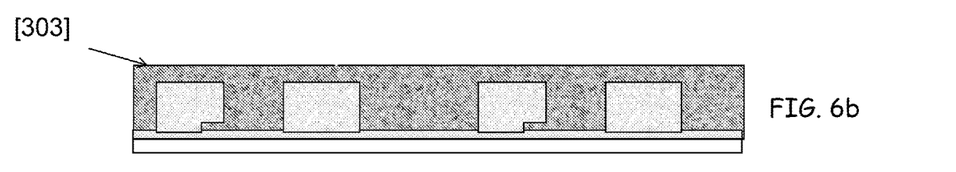

As shown in FIG. 6b, the transmissive regions 301 and 302 may be encapsulated in encapsulant 303. Regions 301 and 303 may be encapsulated in an epoxy material which may be heated to a temperature of 120° C. to 150° C. and cured for ten minutes, for example. However, the techniques described herein are not limited to a particular encapsulant material or curing technique, as any suitable encapsulant materials or curing techniques may be used.

Figure 6C:
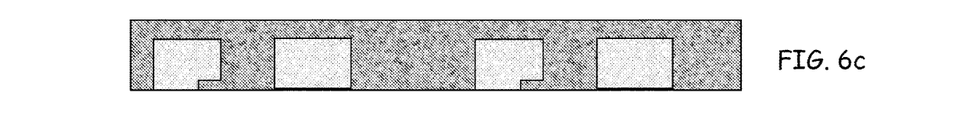

As shown in FIG. 6c, the adhesive 601 may be removed. For example, the adhesive 601 may be removed by removing the handle substrate 602.

Figure 6D:
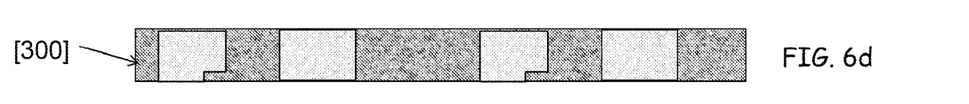

As shown in FIG. 6d, the encapsulant 303 may be subjected to a thinning process to expose the surfaces of transmissive regions 301 and 302 to enable light to pass therethrough. Any suitable thinning process may be used to reduce the thickness of the encapsulant 303, such as a grinding process, for example.

The selectively transmissive structure 300 can thereby be produced using the process illustrated in FIGS. 4-6d.

An optical system 100 may be formed using a process such as that illustrated in FIGS. 7a to 7e-2.

Figure 7A:
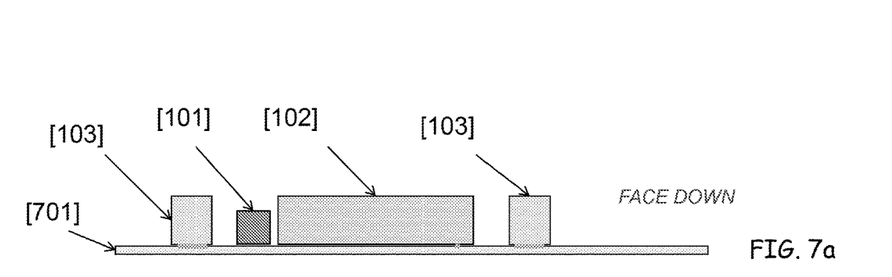

As shown in FIG. 7a, elements of optical system 100 may be placed on an adhesive 701, such as adhesive tape. For example, a device 101 for emitting electromagnetic radiation, sensor chip 102 and one or more one or more metal plugs 103 may be placed on adhesive 701.

Adhesive 701 may be formed on a carrier substrate (not shown).

Figure 7B:
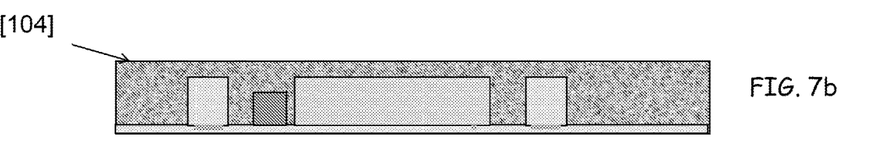

As shown in FIG. 7b, device 101, sensor chip 102 and one or more one or more metal plugs 103 may be encapsulated in an encapsulant 104 such as an epoxy. Any suitable curing process may be used for encapsulant 104, such as the process discussed above.

Figure 7C:
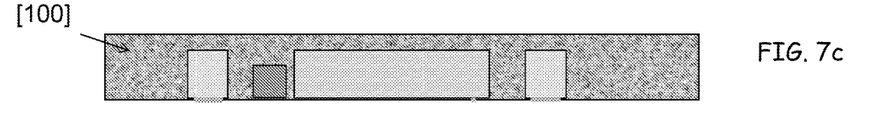

As shown in FIG. 7c, the adhesive 701 may then be removed from the encapsulant 104.

Figure 7D:
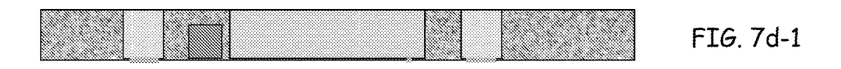
Figure 7D:
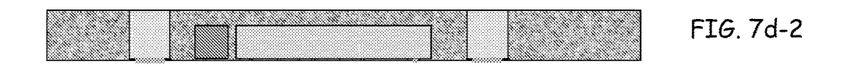
Figure 7E:
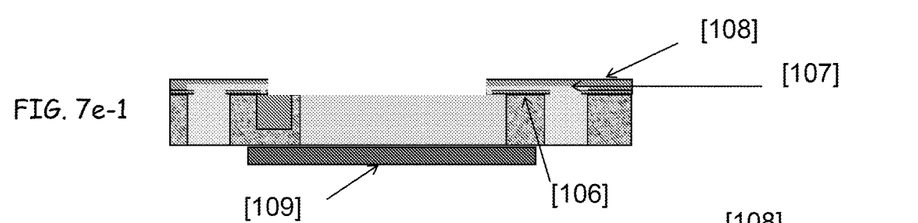
Figure 7E:
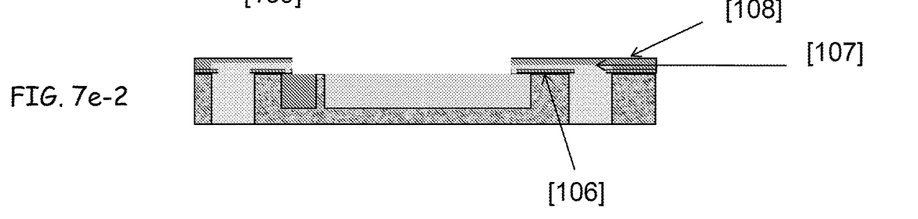

As shown in FIGS. 7d-1 and 7d-2, the optical system 100 may be thinned. Any suitable thinning process may be used to reduce the thickness of the encapsulant 104, such as a grinding process, for example. The thinning process may expose the surface of metal plugs 103 to enable contact to be made thereto. The thinning process may reduce the thickness of the encapsulant 104 to expose the surface of the sensor chip 102, as shown in FIG. 7d-1, or may not expose the surface of the sensor chip 102, as shown in FIG. 7d-2. Thinning the encapsulant in a manner that exposes the surface of the sensor chip 102 may reduce warping of the optical system 100. If sensor chip 102 is formed of silicon, exposing the surface of the sensor chip 102 may allow infrared radiation to penetrate the optical detection sensor through the sensor chip 102, which may be undesirable. Infrared radiation may be prevented from penetrating the sensor chip 102 by forming a protective layer 109 opaque to the infrared radiation on the bottom of the exposed sensor chip 102, as shown in FIG. 7e-1. As further shown in FIG. 7e-1, an isolation layer 106, metal interconnect 107 and passivation layer 108 may be formed on top of the structure. Alternatively, if the thinning process does not expose the surface of the sensor chip 102, the resulting structure with isolation layer 106, metal interconnect 107 and passivation layer 108 is shown in FIG. 7d-2, according to some embodiments.

Figure 8A:
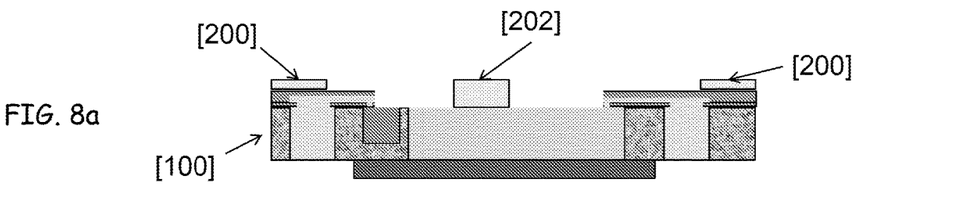
FIGS. 8a-8b show a step of applying a bonding material to the optical system, according to some embodiments.
Figure 8B:
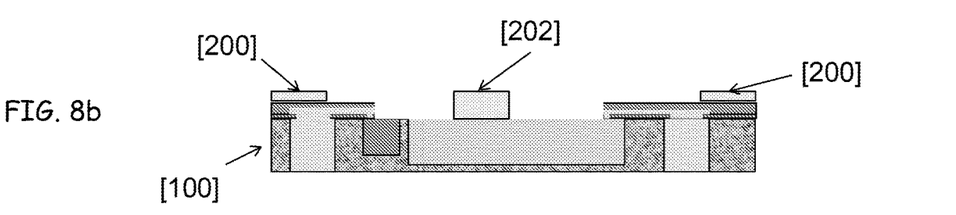

As shown in FIG. 8a, a bonding material 200 may be applied to the upper surface of optical system 100. For example, bonding material 200 may be printed on optical system 100. Bonding material 200 may be a two-sided glue or any other suitable bonding material. In some embodiments, opaque region 202 may be formed of bonding material 200. FIG. 8b shows the same step as illustrated in FIG. 8a for the case where the encapsulant is not thinned all the way to sensor chip 200.

Figure 9:
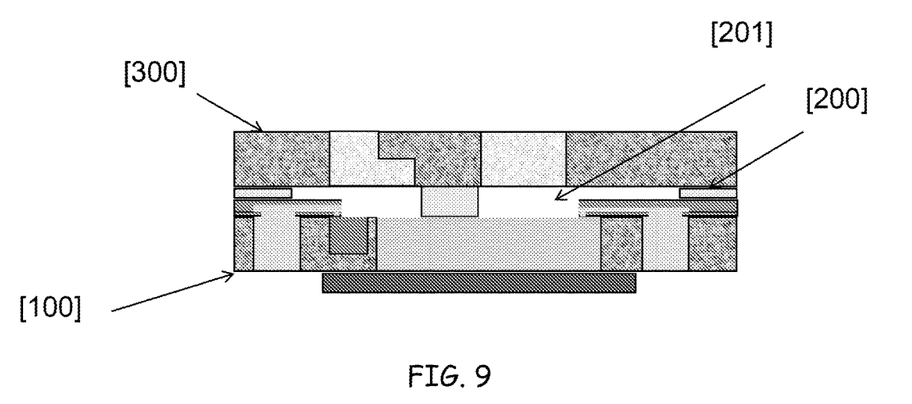
FIG. 9 shows a step of bonding the optical system to the selectively transmissive structure, according to some embodiments.

FIG. 9 shows the bonding of the optical system 100 and the selectively transmissive structure 300. The optical system 100 may be brought into contact with the selectively transmissive structure 300 such that bonding material 200 holds the structures together.

Figure 10:
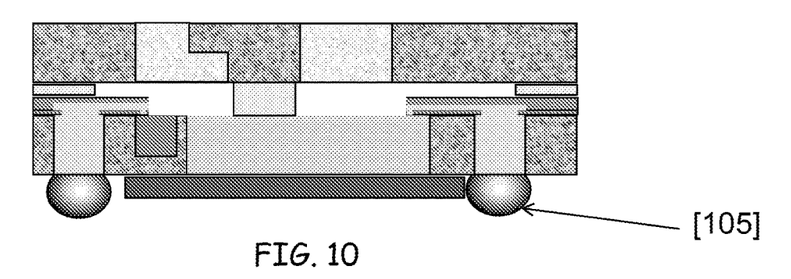
FIG. 10 shows a step of forming solder ball(s) on metal plugs on the bottom of the optical detection sensor, according to some embodiments.

FIG. 10 shows that optionally, one or more solder balls 105 may be formed on the one or more metal plugs 103.

Figure 11:
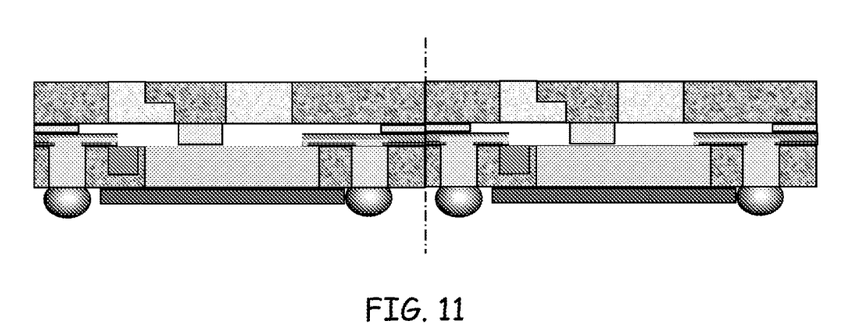
FIG. 11 shows a step of separating a plurality of optical detection sensors formed in the same structure, according to some embodiments.

In some embodiments, multiple optical detection sensors may be formed using the process described above. For example, multiple structures 100 may be formed in the same layer of encapsulant material, and multiple structures 300 may be formed in another layer of encapsulant material, and then the two structures may be bonded together. A singulation step may be performed to separate the individual optical detection sensors by dicing or otherwise cutting the combined structure, as illustrated in FIG. 11.

The apparatus and techniques described herein are not limited in application to the details of construction and the arrangement of components set forth in the foregoing description or illustrated in the drawings. The apparatus and techniques described herein are capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment, it is to be appreciated various alterations, modifications, and improvements will readily occur to those skilled in the art. Accordingly, the foregoing description and drawings are by way of example only.

The invention claimed is:

1. An optical detection apparatus, comprising:
    an optical system having a front surface, comprising:
        a first integrated circuit chip having a top surface including a first sensor and a second sensor;
        a second integrated circuit chip having a top surface including an emitter configured to emit electromagnetic radiation;
        a first opaque encapsulant body which embeds the first and second integrated circuit chips with the top surfaces of the first and second integrated circuit chips exposed; and
        a passivation layer over the first opaque encapsulant body, but not over the first sensor, second sensor and emitter, a top surface of the passivation layer defining the front surface of the optical system;
    an opaque barrier mounted to the top surface of the first integrated circuit chip between the first sensor and the second sensor;
    a selectively transmissive structure having a rear surface, comprising:
        a first region of transmissive material;
        a second region of transmissive material; and
        a second opaque encapsulant body which embeds the first and second regions of transmissive material, a bottom surface of the second opaque encapsulant body being coplanar with a bottom surface of the first region of transmissive material and a bottom surface of the second region of transmissive material and together defining the rear surface of the selectively transmissive structure; and
    means for attaching the rear surface of the selectively transmissive structure at the second opaque encapsulant body to the front surface of the optical system at the passivation layer, the selectively transmissive structure attached in a position where the first region of transmissive material is positioned over the emitter and first sensor and where the second region of transmissive material is positioned over the second sensor.

2. The apparatus of claim 1, wherein the means for attaching comprises an adhesive material.

3. The apparatus of claim 1, further comprising a metal interconnect structure between the first and second integrated circuit chips and the passivation layer.

4. The apparatus of claim 1, wherein the first region has an L-shape in cross-section perpendicular to the top surfaces of the first and second integrated circuit chips.

5. The apparatus of claim 1, wherein the first opaque encapsulant body includes electrical connection vias passing therethrough in a direction perpendicular to the top surfaces of the first and second integrated circuit chips.

6. The apparatus of claim 5, further comprising a metal interconnect structure between the first and second integrated circuit chips and the passivation layer which forms an electrical connection between the electrical connection vias and the first and second integrated circuit chips.

7. An optical detection apparatus, comprising:
an optical system having a front surface, comprising:
a first integrated circuit chip having a top surface including a first sensor and a second sensor;
a second integrated circuit chip having a top surface including an emitter configured to emit electromagnetic radiation;
a first opaque encapsulant body which embeds the first and second integrated circuit chips with the top surfaces thereof exposed; and
a passivation layer extending over both a portion of at least one of the first and second integrated circuit chips and a portion of the first opaque encapsulant body, said passivation layer defining the front surface of the optical system;
a selectively transmissive structure having a rear surface, comprising:
a first region of transmissive material;
a second region of transmissive material;
a second opaque encapsulant body which embeds the first and second regions of transmissive material, a bottom surface of the second opaque encapsulant body being coplanar with a bottom surface of the first region of transmissive material and a bottom surface of the second region of transmissive material and together defining the rear surface of the selectively transmissive structure; and
an adhesive material for mounting the rear surface of the selectively transmissive structure at the second opaque encapsulant body to the passivation layer at the front surface of the optical system in a position where the first region of transmissive material is positioned over the emitter and first sensor and where the second region of transmissive material is positioned over the second sensor.

8. The apparatus of claim 7, further comprising an opaque barrier positioned between the first sensor and the second sensor.

9. The apparatus of claim 7, further comprising a metal interconnect structure between the first and second integrated circuit chips and the passivation layer.

10. The apparatus of claim 7, wherein the first region has an L-shape in cross-section perpendicular to the top surfaces of the first and second integrated circuit chips.

11. The apparatus of claim 7, wherein the first opaque encapsulant body includes electrical connection vias passing therethrough in a direction perpendicular to the top surfaces of the first and second integrated circuit chips.

12. The apparatus of claim 11, further comprising a metal interconnect structure between the first and second integrated circuit chips and the passivation layer which forms an electrical connection between the electrical connection vias and the first and second integrated circuit chips.

\* \* \* \* \*